(12) United States Patent
Kurle

(10) Patent No.: US 9,107,309 B2
(45) Date of Patent: Aug. 11, 2015

(54) SENSOR HOUSING FOR A DIRECT ASSEMBLY OF A WIRING HARNESS BY MACHINE

(71) Applicant: Juergen Kurle, Reutlingen (DE)

(72) Inventor: Juergen Kurle, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/247,625

(22) Filed: Apr. 8, 2014

(65) Prior Publication Data

US 2014/0334080 A1 Nov. 13, 2014

(30) Foreign Application Priority Data

Apr. 11, 2013 (DE) .......................... 10 2013 206 443

(51) Int. Cl.
*H01R 13/64* (2006.01)
*H05K 5/06* (2006.01)
*G01D 11/30* (2006.01)
*H01B 13/012* (2006.01)
*H05K 5/02* (2006.01)

(52) U.S. Cl.
CPC ................. *H05K 5/06* (2013.01); *G01D 11/30* (2013.01); *H01B 13/01236* (2013.01); *H05K 5/0247* (2013.01); *Y10T 29/49208* (2015.01)

(58) Field of Classification Search
CPC . H01B 13/01236; H05K 5/06; H05K 5/0247; H01R 13/405; H01R 13/506; H01R 13/62; H01R 13/745; H01R 13/521; H01R 9/0527

USPC .......................................................... 439/248
See application file for complete search history.

(56) References Cited

U.S. PATENT DOCUMENTS

| | | | | |
|---|---|---|---|---|
| 6,875,024 B2 * | 4/2005 | Nagano | ........................... | 439/63 |
| 6,905,371 B2 * | 6/2005 | Yi-Tse | ......................... | 439/660 |
| 7,153,160 B2 * | 12/2006 | Montena | ....................... | 439/579 |
| 7,182,637 B2 * | 2/2007 | Coyle et al. | ..................... | 439/557 |
| 7,214,080 B2 * | 5/2007 | Ichio et al. | ..................... | 439/248 |
| 7,393,228 B2 * | 7/2008 | Kabasawa et al. | ............ | 439/247 |
| 8,784,139 B2 * | 7/2014 | Durand | ......................... | 439/695 |
| 8,801,460 B2 * | 8/2014 | Van Swearingen et al. | .. | 439/578 |

* cited by examiner

*Primary Examiner* — Jean F Duverne
(74) *Attorney, Agent, or Firm* — Kenyon & Kenyon LLP

(57) ABSTRACT

A system having a plug and a housing having a hollow space at least partially sealed and an electrical supply line, which is connected to an electrical component, which is separated from the space by a pass-through region, which has a first sealing arrangement that seals in media-tight fashion, the line being surrounded at least partially by the first sealing arrangement, and being contactable in the space, the plug having at least one electrical contact for contacting the line and having at least one second sealing arrangement, which is such that for a contacting, the hollow space is sealed in media-tight, the line of the housing and/or the first sealing arrangement having at least one first locking arrangement, and the electrical contact of the plug having at least one second locking arrangement, the locking arrangements providing that for a contacting, an exclusively irreversible positive and/or non-positive locking is provided.

16 Claims, 4 Drawing Sheets

SENSOR HOUSING FOR A DIRECT ASSEMBLY OF A WIRING HARNESS BY MACHINE

FIELD OF THE INVENTION

The present invention is based on a system, including a sensor housing for a direct assembly of a wiring harness by machine.

BACKGROUND INFORMATION

Electronic components having few poles are believed to be understood from the art. These are believed to relate, for example, to airbag sensors, and are standardly mounted by hand by the vehicle manufacturer during final assembly of the vehicle, after installation of the vehicle wiring harness.

According to the art, the production of an electrical connection and the sealing of the system, for example via a plug collar, can be carried out in separate working steps.

SUMMARY OF THE INVENTION

In comparison with the existing art, the system according to the present invention and the method according to the present invention as recited in the coordinate claims have the advantage that electrical contacting and sealing take place in one step, and the assembly can take place reliably and without error, in automated fashion. In addition, due to the omission of previously required separate components, there is a saving of costs, and storage and logistics are simplified. Production costs are further reduced through the omission of additional assembly steps.

In addition, the system according to the present invention requires less constructive space than the systems known from the existing art, and is lighter in weight. The housing may be made of a plastic, in particular of polyethylene, polypropylene, polystyrene, polyester, or a combination of the above-named, or other, plastics, for example elastomers. In this way, advantageously a housing is provided that is particularly robust and that can be produced at low cost using known methods.

Particularly, the housing may have at least one assembly arrangement. Quite particularly, the housing may have a first and a second assembly arrangement, in particular a strap-type assembly arrangement and/or an annular assembly arrangement. In this way, a particularly simple and stationary assembly of the housing, for example on a wiring harness, is advantageously enabled, in particular without requiring separate assembly arrangement, advantageously further simplifying logistics and reducing overall costs. The hollow space may be an oblong, in particular tube-shaped, hollow space. Particularly, the hollow space may have an opening at one end, in particular at an end face, in particular at the end face remote from the sensor. Quite particularly, the opening may occupy the entire end face.

In this way, a particularly simple assembly of the housing to the plug is possible. Still more particularly, the hollow space may be subdivided into at least two hollow spaces, in particular into two symmetrical hollow spaces. In this way, it is advantageously possible, due to a simple and low-cost configuration, to provide an integrated guide device for centering the plug.

The at least one hollow space may have a cross-section that is essentially circular or elliptical, the cross-section being in particular capable of being made variable, and in particular the cross-section essentially becoming larger in the direction of the opening. In this way as well, a guiding of the plug onto the electrical supply line is advantageously enabled. The electrical supply line may have an oblong main extension. Particularly, the electrical supply line may be fashioned in the shape of a small rod or tongue. Quite particularly, the electrical supply line in the first hollow space may be fashioned at least partly as a mount for the electrical component. For example, it is conceivable for the electrical supply line to be bent in the area of the component in such a way that the component can be clamped into the electrical supply line, the electrical supply line in particular exerting an elastic force on the component in order to fix it in its position.

In this way, in a particularly advantageous manner a fixed (in the sense of stationary) situation of the component is enabled without additional holding arrangement, whereby lower production costs are possible and additional working steps are omitted. Still more particularly, the electrical supply line may be configured for power supply and/or transmission of information; in particular, one electrical supply line is configured for power supply and a further electrical supply line is configured for the transmission of. Further, the housing may have at least two electrical supply lines, or the electrical supply line is fashioned in multiple parts, in particular in two parts, at least in the area at the electrical contacting.

In this way, advantageously a particularly simple configuration of the housing and a particularly simple contacting of the component are enabled. The pass-through region may be fashioned as a hollow space having a small cross-section. Particularly, the cross-section of the pass-through region may be variable over its length, where "length" refers to the extension parallel to the main extension of the electrical supply line. In particular, "variable" means that the pass-through region has local regions having a larger cross-section, the first sealing arrangement engaging in the local regions having larger cross-section with a positive fit, with a non-positive fit, and/or with a material fit. In this way, a particularly simple fastening of the first sealing arrangement is enabled. Here, "larger" and/or "smaller" and/or "small" refer to the cross-section of the hollow space, in particular to the cross-section in the region of the opening.

The first sealing arrangement may be made of a plastic, in particular of polyethylene, polypropylene, polystyrene, polyester, or a combination of the above-named, or other, plastics, for example elastomers. In this way, advantageously a first sealing arrangement is provided that is particularly robust and that can be produced at low cost using known methods. Particularly, the sealing arrangement may be connected to the pass-through region with a positive fit, with a non-positive fit, and/or with a material fit. Quite particularly, the first sealing arrangement may have at least one hole, as a first locking arrangement, in the region of the end of the electrical supply line that is to be electrically contacted by the plug, along its circumference. Quite particularly, the first sealing arrangement may have, in the region of the end of the electrical supply line that is to be electrically contacted by the plug, a spacing from the electrical supply line, so that the electrical contact of the plug can be introduced between the first sealing arrangement and the electrical supply line, in particular in the sense of a sleeve surrounding the electrical supply line completely or partially.

In this way, it is possible in a particularly advantageous manner to additionally use the first sealing arrangement as a locking arrangement and/or as a guide arrangement, making it possible to omit separate locking arrangement and/or guide arrangement. The omission of additional parts advantageously enables a simpler and lower-cost production.

Moreover, the system according to the present invention can be produced with such a precise fit that the required tolerance ranges of a plurality of components can be done without, increasing the tightness, robustness, and useful life of the system. Still more particularly, the first sealing arrangement may be situated along the circumference of the electrical supply line. In this way, advantageously a particularly good sealing of the component is enabled. The electrical contact of the plug may be produced as an electrical line having a single-wire seal.

Particularly, the electrical line may have at one end at least one exposed contact for electrical contacting with the electrical supply line of the housing. Quite particularly, the contact may be fashioned such that the second locking arrangement can be produced in one piece with the contact, in particular in such a way that the second locking arrangement is a part of the contact. This is to be understood as meaning that the second locking arrangement is also capable of being electrically contacted. The second sealing arrangement may be made of a plastic, in particular polyethylene, polypropylene, polystyrene, polyester, or a combination of the above-named, or other, plastics, for example elastomers. In this way, advantageously a particularly robust sealing arrangement is provided that can be produced at low cost using known methods.

Particularly, the second sealing arrangement may be fashioned around the entire circumference of the electrical contact. Quite particularly, the second sealing arrangement may have a cross-section corresponding to the cross section of the hollow space. In this way, advantageously a particularly simple and good sealing of the hollow space is enabled. An exclusively irreversible locking is understood by those skilled in the art as a locking that cannot be released without destruction after the interaction of the locking elements has taken place. The method steps of the method according to the present invention may be carried out chronologically, in particular in the sequence named in the claim.

Alternatively, other sequences of some or all method steps are also conceivable. In addition, the first through third method step can be exchanged in an arbitrary sequence, and/or can be carried out simultaneously in arbitrary combination (i.e., the first and the second and the third step, or the first and the second step, or the first and the third step, or the second and the third step can be carried out simultaneously). In this way, it is advantageously possible to shorten the duration of the process through the simultaneous execution of method steps, and, through the process sequence, to flexibly adapt the process to different requirements, reducing the costs for production and assembly of the system through more efficient process organization.

Advantageous embodiments and developments of the present invention can be learned from the subclaims, and from the description, with reference to the drawings.

According to a specific embodiment, the housing and/or the first sealing arrangement and/or the second sealing arrangement can each be produced in one piece, in particular using an injection-molding and/or extrusion method, and in particular as extrusion-coated parts. Particularly, the first sealing arrangement can be produced in one piece with the housing. Quite particularly, the second sealing arrangement can be produced as an extrusion-coated part around the electrical contact and/or the electrical line. Still more particularly, the electrical supply line can also be produced in one piece with the housing and/or with the first sealing arrangement as a molded interconnect device (MID), for example using a two-component injection-molding method, or via hot stamping or laser-based methods (laser direct structuring (LDS) or subtractive laser structuring). In this way, it is advantageously possible to produce the system in a particularly simple and low-cost manner using known and proven methods, thus reducing production costs.

According to a specific embodiment, the hollow space and/or the second sealing arrangement has at least one guide arrangement, in particular a centering arrangement. Particularly, the at least one guide arrangement may be configured such that when the housing and the plug are brought together in order to create a electrical contacting, the housing and the plug assume a particular position relative to one another, such that in this position, in particular only in this position, the electrical supply line and the electrical contact can be electrically contacted to one another, and/or the first locking arrangement and the second locking arrangement can be locked together.

Thus, for example the hollow space is fashioned so as to narrow in the shape of a funnel in the direction of the component, or the hollow space has an asymmetrical cross-section, the second sealing arrangement having the same asymmetrical cross-section for positive-fitting interaction with the hollow space, or the second sealing arrangement has projections that interact with corresponding indentations on the inside of the hollow space in such a way that the housing and the plug can be brought together only in one possible position. The person skilled in the art will understand that, conversely, the second sealing arrangement can also have indentations that interact with corresponding projections on the inside of the hollow space to form a positive fit. In particular, the indentations and projections are fashioned as a guide rail system. In this way, advantageously the process automation is facilitated, because a precise position does not have to be set manually. Through the locking and the guide arrangement, the production and assembly process can also be carried out in automated fashion, without error, and so as to be capable of being monitored.

According to a specific embodiment, the component is a micromechanical component, in particular a micromechanical sensor. In this way, advantageously a component is possible that is compact in terms of constructive space. Such a micromechanical sensor, in particular also designated a micro-electromechanical sensor or a microsystem, may be an acceleration sensor and/or a rotation sensor.

According to a specific embodiment, the locking is a snap connection, and the first locking arrangement is a first snap arrangement, in particular a snap-in opening, and the second locking arrangement is a second snap arrangement, in particular a snap nose. Particular, the first sealing arrangement may have the snap-in opening and the electrical contact has the snap nose. In the case of electrical contacting between the electrical supply line and the electrical contact, the snap nose then snaps together with the snap-in opening. Because at the same time the second sealing arrangement seals the hollow space, the snap connection can no longer be detached (from outside) without destroying the housing and/or the plug; rather, the plug and the housing are permanently snap-locked together.

Alternatively, the electrical supply line has the snap-in opening, whereby advantageously a snap connection at the same time enables an electrical contacting. Quite particularly, the snap-in opening can be realized directly during the production of the first sealing arrangement, without additional process steps and in particular without additional costs. In this way, it is advantageously possible to save production costs and to provide a simple and nonetheless reliable locking or snap connection. The hollow space and the second sealing arrangement may have further interacting locking arrangement, in particular snap arrangement. In this way, a particularly secure locking is enabled through a primary locking and a secondary locking.

According to a specific embodiment, the electrical supply line of the housing and/or the electrical contact of the plug have few poles. In this way, the expense of wiring is advantageously kept to a necessary minimum, saving production and assembly costs.

According to a specific embodiment, the electrical supply line and/or the electrical contact are fashioned as crimp connectors. In this way, advantageously the production costs are reduced, because standard commercially available crimp contacts can be used in the production process. In addition, crimp contacts are very well-suited for automated production by machine.

According to a further specific embodiment of the method according to the present invention, the method is carried out in automated fashion and/or is monitored in automated fashion. In this way, particularly advantageously a cost reduction of the production process and of the assembly process is possible, because all process steps can take place in automated fashion, and quality control can also take place in automated fashion without requiring for example manual assembly and/or later correction.

Thus, a system is provided having a housing, in particular a sensor housing, and a plug, the housing having at least one hollow space that is at least partially sealed and having at least one electrical supply line, the electrical supply line being connected in electrically conductive fashion to at least one electrical component situated in the housing, the component being separated from the hollow space by a pass-through region, the pass-through region having at least one first sealing arrangement that seals in media-tight, in particular liquid-tight, fashion, the electrical supply line being surrounded at least partially by the first sealing arrangement, the electrical supply line being capable of being electrically contacted in the hollow space, the plug having at least one electrical contact for electrical contacting with the electrical supply line and having at least one second sealing arrangement, the second sealing arrangement being provided such that when there is an electrical contacting of the electrical supply line with the electrical contact, the hollow space is sealed in media-tight, in particular liquid-tight, fashion, the electrical supply line of the housing and/or the first sealing arrangement having at least one first locking arrangement, and the electrical contact of the plug having at least one second locking arrangement, the first locking arrangement and the second locking arrangement being configured such that when there is an electrical contacting of the electrical contact with the electrical supply line, an exclusively irreversible positive and/or non-positive locking is brought about.

DETAILED DESCRIPTION

Figure 1:
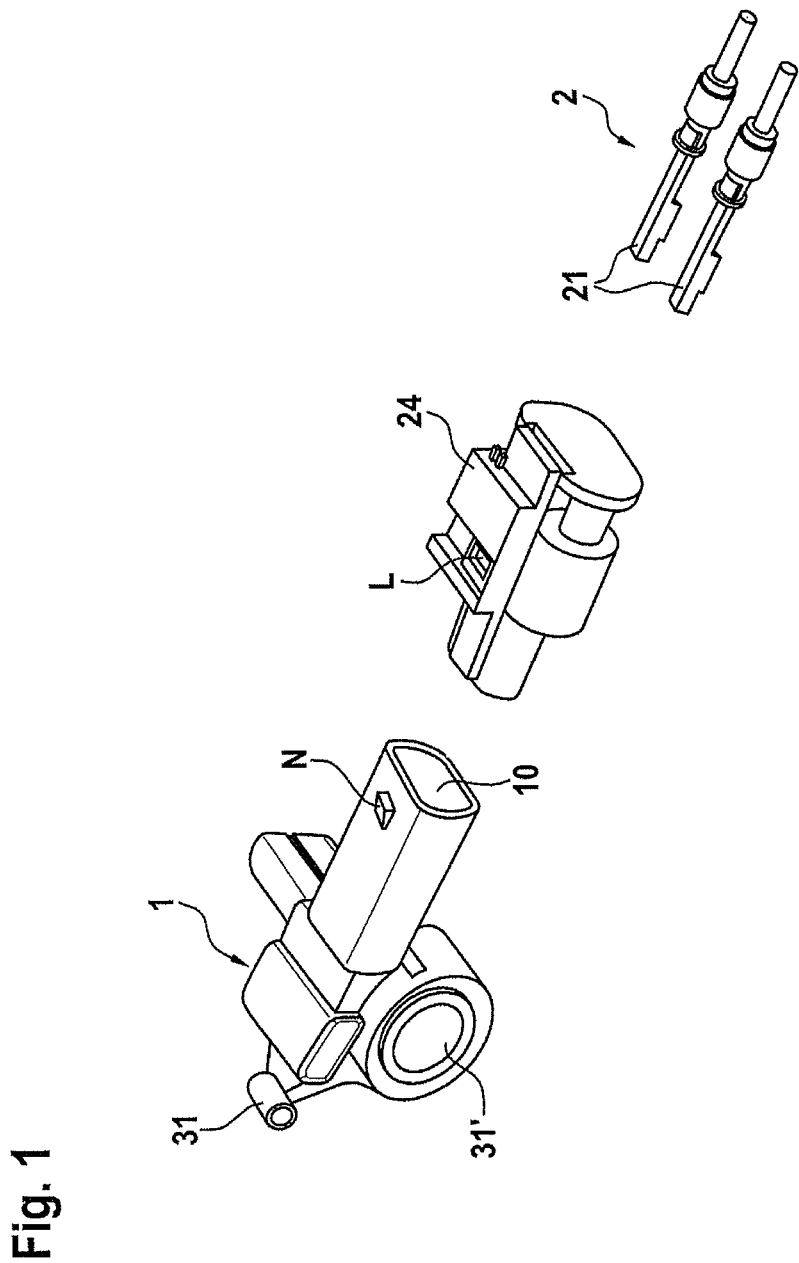
FIG. 1 shows a perspective representation of a system from the existing art.

The present invention is described with reference to particular embodiments and with reference to the accompanying drawings, but the present invention is not limited to these embodiments and drawings, but rather is determined by the patent claims. The drawings are not to be interpreted as limiting. In the drawings, for the purposes of representation particular elements may be enlarged or exaggerated, and may be shown not to scale.

Unless otherwise specifically indicated, the use of an indefinite or definite article referring to a word in the singular, for example "a" or "the," also includes the plural of such a word. The designations "first," "second," and so on, in the description and in the claims, are used to distinguish similar elements, or identical elements that are to be distinguished, and are not necessarily used for the description of a temporal or other sequence. The terms used in this way are fundamentally to be regarded as being interchangeable under suitable conditions.

In the various Figures, identical parts have always been provided with the same reference characters, and are therefore as a rule only named or mentioned once.

FIG. 1 shows a perspective representation of a system from the existing art. A housing 1 has a hollow space 10 and two assembly arrangements 31 and 31'. In housing 1 there is situated a component that is to be electrically contacted by a plug 2, the plug here being made up of two separate electrical contacts 21 that are essentially identical. In order to seal housing 1 after contacting with plug 2, a plug collar 24 is placed between plug 2 and housing 1, as an adapter. Here, plug collar 24 is introduced into housing 1 and is reversibly locked with a locking nose N via a hole L. The correct electrical contacting of electrical contacts 21 with the component however cannot be monitored. In the case of faulty assembly, the locking between hole L and locking nose N must be detached, and plug 2 as well as plug collar 24 must be detached from housing 1, and possibly re-introduced.

Figure 2:
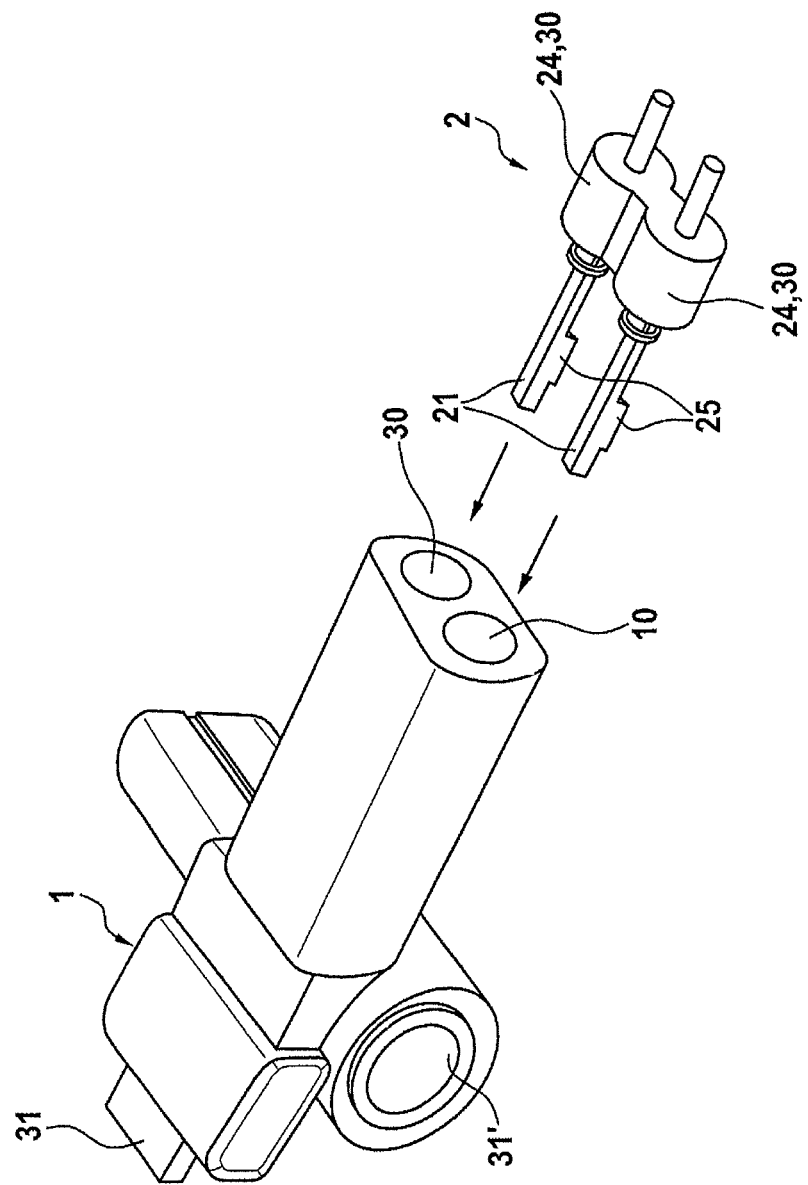
FIG. 2 shows a perspective representation according to an advantageous specific embodiment of the system according to the present invention.

In contrast, FIG. 2 shows a perspective representation according to an advantageous specific embodiment of the system according to the present invention. Housing 1 again has a strap-type assembly arrangement 31 and an annular assembly arrangement 31'. The inner side of annular assembly arrangement 31' may have a cladding made of an anti-slip material, for example a soft elastomer, in order to prevent rotation around the fastening arrangement, for example a wiring harness. In addition, such a rotation can be prevented by a fixing of housing 1 via strap-type assembly arrangement 31. For this purpose, for example positive-fit arrangement such as nails or bolts or rivets can be used to fasten housing 1 at a suitable point. Alternatively, material bonding arrangement such as adhesives or welds are also possible. The housing has a hollow space 10 that here is realized as a two-part hollow space 10. This two-part hollow space 10 has an opening into which plug 2 is introduced for electrical contacting, symbolized in the drawing by arrows. Moreover, the division into two parts of the hollow space realizes a guide arrangement 30, because due to the positive fit of a second sealing arrangement 24 (of plug 2) with two-part hollow space 10, electrical contacts 21 are brought automatically into the position required for the electrical contacting. Therefore, sealing arrangement 24 at the same time acts as a guide arrangement 30. Alternatively, it is possible for the second sealing arrangement to have a recess or projection on its surface that works together to form a positive fit with a corresponding complementary projection or recess on the inside of hollow space 10. In particular, such a variant makes sense if the housing has only one hollow space 10. Here, such a combination of projection and recess can be fashioned as a guide rail system, where either second sealing arrangement 24 or hollow space 10 has the rail, and the respective other element has the associated groove that accepts the rail. In addition or alternatively, it is possible for the cross-section of hollow space 10, and correspondingly the cross-section of second sealing arrangement 24, to be formed in such a manner that a positively fitting interaction is ensured only in one position relative to one another. For example, this could be an asymmetrical cross-section. In the depicted specific embodiment, electrical contacts 21 are realized as standard commercially available crimp contacts. The electrical contacts have on their underside a snap projection, or a second locking arrangement 25, in the form of a snap nose 25. Second sealing arrangement 24 may be integrally formed in one piece in circumferential fashion around the electrical lines of plug 2, for example by an injection-molding method or extrusion method. Housing 1 can also be produced by such a method. The electrical lines of plug 2 have a single-wire seal that however does not extend into the region of electrical contacts 21. For the electrical contacting of housing 1 with plug 2, plug 2 is introduced into hollow space 10. Here, second sealing arrangement 24 automatically seals hollow space 10. For this purpose, it is possible for second sealing arrangement 24 to have a cross-section that is slightly larger than the cross-section of hollow space 10, but has the same shape. In this way, second sealing arrangement 24 is compressed when introduced into housing 1, and seals hollow space 10 in media-tight, in particular liquid-tight, fashion. Alternatively or in addition, it is possible for second sealing arrangement 24 to have a soft, media-tight material, in the sense of a sealing lip, overall or at its surface coming into contact with the inside of housing 1 or at at least one location along its circumference. Such a material may be fashioned in one piece with second sealing arrangement 24.

Figure 3:
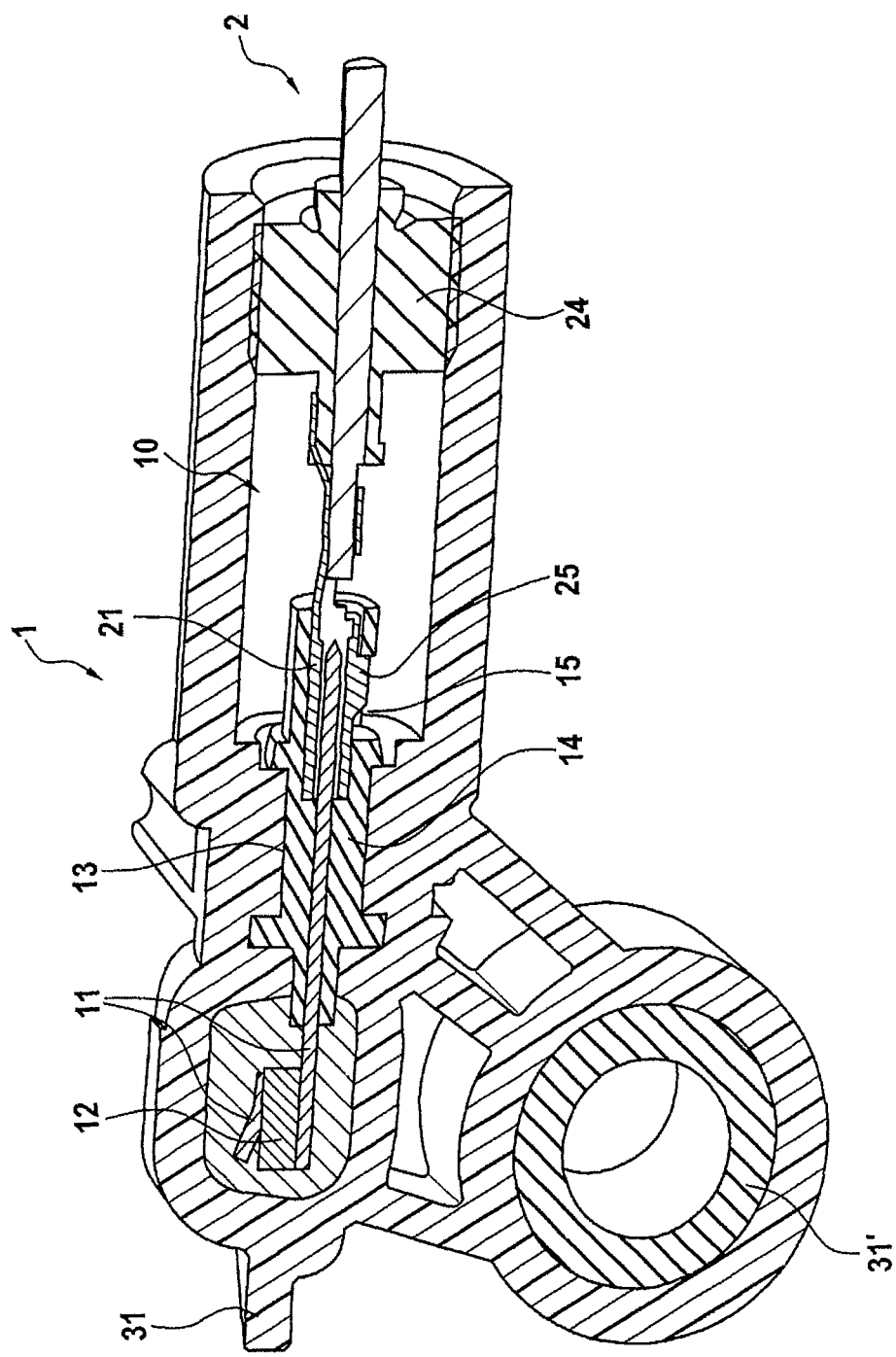
FIG. 3 shows a sectional representation according to the advantageous specific embodiment of the system according to the present invention in the assembled state.

FIG. 3 shows a sectional representation according to the advantageous specific embodiment of the system according to the present invention in the assembled state. The specific embodiment corresponds to the specific embodiment shown in FIG. 2. In housing 1, there is situated a component 12, for example a micromechanical inertial sensor 12. Component 12 is contacted by at least one electrical supply line 11. Here, electrical supply line 11 is fashioned such that it simultaneously acts as a mount for component 12. For this purpose, it is completely or partly bent at its end so that a pre-tensioned mount results into which component 12 is clamped. The component is separated from the hollow space by a pass-through region 13. This pass-through region 13 is sealed in media-tight, in particular liquid-tight, fashion by a first sealing arrangement 14. First sealing arrangement 14 may be also capable of being produced in an injection molding or extrusion method. Here, first sealing arrangement 14 can also be produced in one piece with housing 1. As material for first sealing arrangement 14 and/or second sealing arrangement 24 and/or housing 1, polyethylene, polypropylene, polystyrene, and/or polyester, or an arbitrary combination of the above-named or other plastics (for example elastomers), are particularly suitable. As shown in the drawing, it is possible for housing 1 to have openings in pass-through region 13 into which first sealing arrangement 14 engages with a positive fit. First sealing arrangement 14 surrounds electrical supply line 11 completely in pass-through region 13. In the region of the electrical contacting between electrical supply line 11 and electrical contacts 21, first sealing arrangement 14 surrounds electrical supply line 11 at least partially. At at least one point along its circumference, first sealing arrangement 14 has a first locking arrangement 15 in the form of a snap-in opening 15, snap-in opening 15 being realized in cost-neutral fashion in the production process. According to the depicted specific embodiment, first sealing arrangement 14 has a slight spacing from electrical supply line 11 in the region of the electrical contacting, so that for the purpose of the electrical contacting electrical contacts 21 surround electrical supply line 11, which corresponding to the two-wire representation according to FIG. 2 can also be fashioned as two electrical supply lines 11 or as a two-part electrical supply line 11. In the electrical contacting, snap nose 25 engages in snap-in opening 15, and in this way locks housing 1 permanently to plug 2. This locking in the form of a snap connection is irreversible, because due to the sealing of hollow space 10 by second sealing arrangement 24, access to snap nose 25 and/or to snap-in opening 15 is not possible without at least partial destruction of housing 1 and/or of plug 2. Guide arrangement 30 ensure that electrical contacts 21 meet first sealing arrangement 14 and/or electrical supply line 11 exactly in such a way that a proper snap connection takes place. Alternatively or in addition, hollow space 10 and second sealing arrangement 24 can be fashioned such that their shape assumes the function of a guide arrangement 30. For example, hollow space 10 and second sealing arrangement 24 can be correspondingly fashioned with complimentary funnel shapes, so that when plug 2 is introduced into housing 1 the electrical contacts are automatically oriented to the opening of first sealing arrangement 14 or to electrical supply line 11. To someone skilled in the art, it will be clear that electrical contacts 21 and electrical supply line 11 can also be fashioned in corresponding complementary fashion to the depicted specific embodiment in their contact region as well, so that for example for the electrical contacting electrical supply line 11 surrounds electrical contacts 21. In this case, electrical supply line 11 has snap-in opening 15 alternatively or in addition to first sealing arrangement 14.

Figure 4:
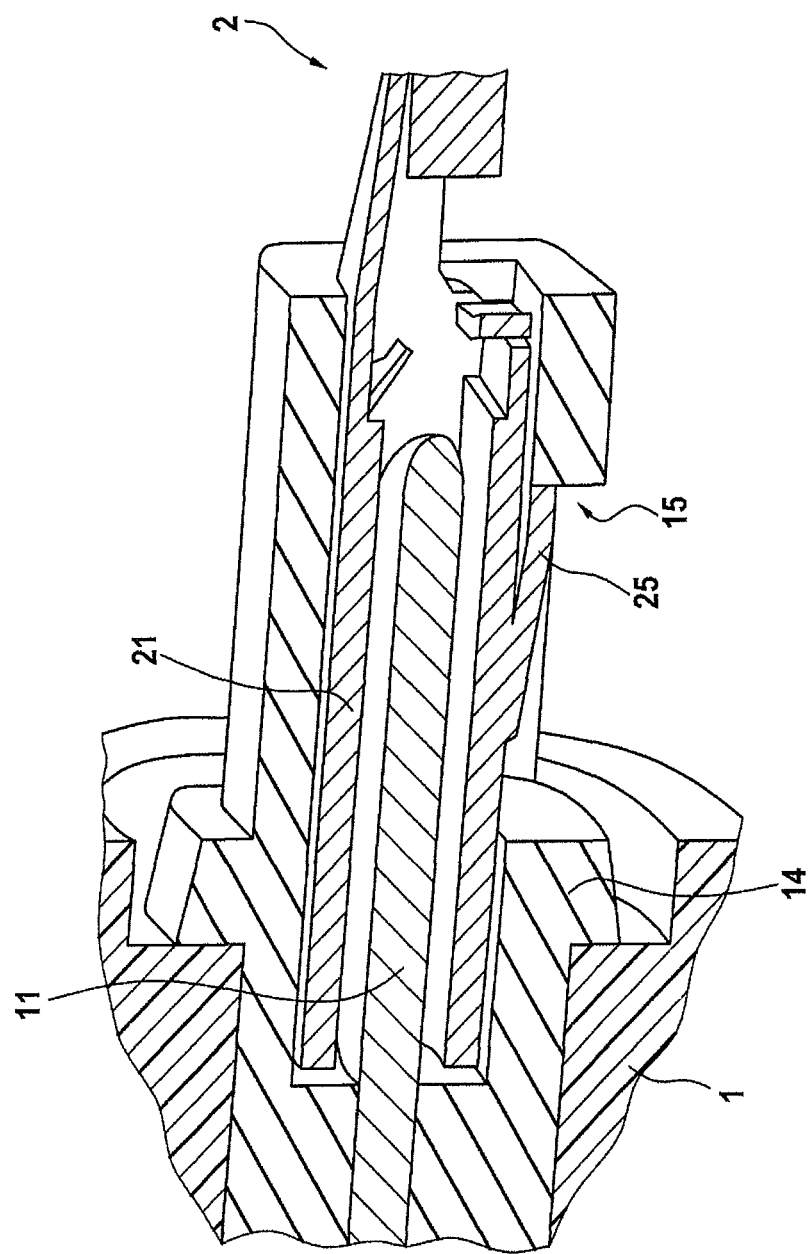
FIG. 4 shows a detailed sectional representation according to the advantageous specific embodiment of the system according to the present invention in the assembled state.

FIG. 4 shows a detailed sectional representation according to the advantageous specific embodiment of the system according to the present invention in the assembled state. In particular, the locking is shown there in detail. Thus, depicted electrical contact 21 has a snap nose 25 fashioned in one piece that engages into snap-in opening 15 in the state in which the electrical contacting has been achieved. In addition, first sealing arrangement 14 according to the depicted specific embodiment has a projection that is adjacent to pass-through region 13 and thus provides a better seal.

What is claimed is:

1. A system, comprising:
   a housing; and
   a plug;
   wherein the housing has at least one hollow space that is at least partially sealed, at least one electrical supply line connected electrically to at least one electrical component situated in the housing, the component being separated from the hollow space by a pass-through region having at least one first sealing arrangement that seals in media-tight fashion, the electrical supply line being surrounded at least partially by the first sealing arrangement, the electrical supply line being electrically contactable in the hollow space,
   wherein the plug has at least one electrical contact for electrically contacting the electrical supply line, and having at least one second sealing arrangement, which is arranged such that when there is an electrical contacting of the electrical supply line with the electrical contact the hollow space is sealed in media-tight fashion, and
   wherein at least one of the electrical supply line of the housing and the first sealing arrangement has at least one first locking arrangement, and the electrical contact of the plug having at least one second locking arrangement, the first locking arrangement and the second locking arrangement being configured such that when there is an electrical contacting of the electrical contact with the electrical supply line, an exclusively irreversible positive and/or non-positive locking occurs.

2. The system of claim 1, wherein at least one the housing, the first sealing arrangement, and the second sealing arrangement are each capable of being produced in one piece.

3. The system of claim 1, wherein at least one of the hollow space and the second sealing arrangement have at least one guide arrangement.

4. The system of claim 3, wherein the at least one guide arrangement is configured such that when the housing and the plug are brought together to produce an electrical contacting, the housing and the plug assume a particular position relative to one another, such that in this position, in particular only in this position, at least one of the following is satisfied: (i) the electrical supply line and the electrical contact are electrically contactable, and (ii) the first locking arrangement and the second locking arrangement are lockable.

5. The system of claim 1, wherein the component is a micromechanical component.

6. The system of claim 1, wherein the locking is a snap connection, and the first locking arrangement is a first snap arrangement, and the second locking arrangement is a second snap arrangement.

7. The system of claim 1, wherein at least one of the electrical supply line of the housing and the electrical contact of the plug have few poles.

8. The system of claim 1, wherein at least one of the electrical supply line and the electrical contact are configured as crimp connectors.

9. A method for producing a system, the method comprising:
producing a housing;
providing a first sealing arrangement in a pass-through region;
providing a second sealing arrangement on a plug;
installing the housing at a destination location;
providing that the plug is electrically contacted to the housing, and
providing that an electrical contact is electrically contacted with at least one electrical supply line, so that at least one first locking arrangement and at least one second locking arrangement interact in an exclusively irreversibly locking manner;
wherein the system includes the housing and the plug,
wherein the housing has at least one hollow space that is at least partially sealed, the at least one electrical supply line connected electrically to at least one electrical component situated in the housing, the component being separated from the hollow space by the pass-through region having the at least one first sealing arrangement that seals in media-tight fashion, the electrical supply line being surrounded at least partially by the first sealing arrangement, the electrical supply line being electrically contactable in the hollow space,
wherein the plug has at least one electrical contact for electrically contacting the electrical supply line, and having the at least one second sealing arrangement, which is arranged such that when there is an electrical contacting of the electrical supply line with the electrical contact the hollow space is sealed in media-tight fashion, and
wherein at least one of the electrical supply line of the housing and the first sealing arrangement has the at least one first locking arrangement, and the electrical contact of the plug having the at least one second locking arrangement, the first locking arrangement and the second locking arrangement being configured such that when there is an electrical contacting of the electrical contact with the electrical supply line, an exclusively irreversible positive and/or non-positive locking occurs.

10. The method of claim 9, wherein the method is at least one of performed and monitored in an automated fashion.

11. The system of claim 1, wherein the housing is a sensor housing.

12. The system of claim 1, wherein media tight includes liquid tight.

13. The system of claim 1, wherein at least one the housing, the first sealing arrangement, and the second sealing arrangement are each capable of being produced in one piece, by at least one of an injection-molding and an extrusion process, as extrusion-coated parts.

14. The system of claim 1, wherein at least one of the hollow space and the second sealing arrangement have at least one guide arrangement, which includes a centering arrangement.

15. The system of claim 1, wherein the component is a micromechanical component.

16. The system of claim 1, wherein the locking is a snap connection, and the first locking arrangement is a first snap arrangement, including a snap-in opening, and the second locking arrangement is a second snap arrangement, including a snap nose.

* * * * *